(12) United States Patent
Frisken

(10) Patent No.: US 8,867,580 B2
(45) Date of Patent: Oct. 21, 2014

(54) WAVELENGTH TUNABLE LASER

(71) Applicant: Steven James Frisken, Vaucluse (AU)

(72) Inventor: Steven James Frisken, Vaucluse (AU)

(73) Assignee: Finisar Corporation, Horsham, PA (US)

( * ) Notice: Subject to any disclaimer, the term of this patent is extended or adjusted under 35 U.S.C. 154(b) by 8 days.

(21) Appl. No.: 13/893,420

(22) Filed: May 14, 2013

(65) Prior Publication Data

US 2013/0308662 A1 Nov. 21, 2013

Related U.S. Application Data

(60) Provisional application No. 61/647,339, filed on May 15, 2012.

(51) Int. Cl.

| H01S 3/10 | (2006.01) |
|---|---|
| H01S 5/14 | (2006.01) |
| G02F 1/01 | (2006.01) |
| H01S 3/00 | (2006.01) |
| G02F 1/1333 | (2006.01) |
| H01S 3/1055 | (2006.01) |
| G02F 1/29 | (2006.01) |
| H01S 5/022 | (2006.01) |
| H01S 3/082 | (2006.01) |
| H01S 3/106 | (2006.01) |

(52) U.S. Cl.
CPC .............. *H01S 3/0085* (2013.01); *H01S 5/141* (2013.01); *G02F 2201/305* (2013.01); *G02F 1/01* (2013.01); *G02F 1/133371* (2013.01); *H01S 5/02248* (2013.01); *H01S 3/1055* (2013.01); *G02F 2203/50* (2013.01); *H01S 3/0826* (2013.01); *H01S 3/106* (2013.01); *G02F 2203/24* (2013.01); *G02F 2203/585* (2013.01); *G02F 1/292* (2013.01)
USPC ................................. 372/20; 372/18; 372/23

(58) Field of Classification Search
USPC .............................................. 372/20, 18, 23
See application file for complete search history.

(56) References Cited

U.S. PATENT DOCUMENTS

| 6,141,361 | A | 10/2000 | Mears et al. | |
|---|---|---|---|---|
| 6,327,019 | B1 * | 12/2001 | Patel et al. | 349/196 |
| 2002/0131691 | A1 * | 9/2002 | Garrett et al. | 385/24 |
| 2005/0036202 | A1 * | 2/2005 | Cohen et al. | 359/495 |
| 2010/0246618 | A1 | 9/2010 | Sudo et al. | |

FOREIGN PATENT DOCUMENTS

| WO | 03/032071 A1 | 4/2003 |
|---|---|---|
| WO | 2004/005993 A1 | 1/2004 |

OTHER PUBLICATIONS

"Supplementary Search Report" For EP 05749258.9-2217/1766819, Jan. 21, 2013, European Patent Office, Munich, Germany.
Warr, et al., Optically Transparent Digitally Tunable Wavelength Filter, Electronics Letters, Jan. 19, 1995, pp. 129-130, vol. 31, No. 2.
De Merlier, et al., Full C-Band External Cavity Wavelength Tunable Laser Using a Liquid-Crystal-Based Tunable Mirror, IEEE Photonics Technology Letters, Mar. 2005, pp. 681-683, vol. 17, No. 3.
Chang, et al., Tunable External Cavity Laser With a Liquid-Crystal Subwavelength Resonant Grating Filter As Wavelength-Selective Mirror, IEEE Photonics Technology letters, Jul. 15, 2007, pp. 1099-1101, vol. 19, No. 14.

* cited by examiner

*Primary Examiner* — Kinam Park
(74) *Attorney, Agent, or Firm* — Kurt Rauschenbach; Rauschenbach Patent Law Group, LLC

(57) ABSTRACT

Described herein is a tunable optical filter (1). The filter includes a phase manipulation layer in the form of a liquid crystal material (3) and a diffractive layer in the form of a diffraction grating (5) sandwiched between an upper glass layer (7) and lower silicon layer (9). Grating (5) includes a grating structure (11) etched therein for angularly diffracting an input optical signal into a plurality of constituent wavelength components according to wavelength. Material (3) includes a two-dimensional array of independently addressable pixels (13), each pixel configured for receiving a drive signal and, in response to the drive signal, selectively modifying the phase of the wavelength components incident onto each pixel to directionally steer the components along respective angularly separated paths. By suitable steering of the wavelength components, at least one wavelength component is coupled along a predetermined collection path to an optical system such as a laser cavity.

24 Claims, 16 Drawing Sheets

WAVELENGTH TUNABLE LASER

CROSS-REFERENCE TO RELATED APPLICATION

This application claims priority to U.S. Provisional Patent Application Ser. No. 61/647,339, entitled "Wavelength Tunable Laser," filed on May 15, 2012. This application is herein incorporated by reference.

FIELD OF THE INVENTION

The present invention relates to a wavelength tunable optical filter. Embodiments of the invention have been particularly developed for providing a wavelength tunable laser. While some embodiments will be described herein with particular reference to that application, it will be appreciated that the invention is not limited to such a field of use, and is applicable in broader contexts.

BACKGROUND

Any discussion of the background art throughout the specification should in no way be considered as an admission that such art is widely known or forms part of common general knowledge in the field.

To manage increased demand for higher bandwidth and data rates, optical systems are increasingly relying on coherent transmission and detection. Such coherent systems require tunable narrow-linewidth lasers as local oscillators. To achieve the narrow linewidth requirements, external cavity lasers are often utilized. Current tunable laser sources suffer from disadvantages such as high optical loss, high sensitivity to system perturbations, limited wavelength tuning and bulky moving mechanical parts.

The tunability of a wavelength tunable laser is typically provided by a tunable optical filter, which selects the output wavelength for laser operation. U.S. Pat. No. 6,141,361 to Mears et al., entitled "Wavelength selective filter", suggests a wavelength tunable filter formed from a liquid crystal spatial light modulator and a fixed diffraction grating. Such a system, having both a transmissive or reflective grating and liquid crystal device requires a bulky optical configuration and complexity in efficiently coupling between the optical elements. Further, Mears et al. does not provide capability for controlling phase of the tuned wavelengths.

A second known wavelength tunable laser utilizes a liquid crystal cell to provide a resonant waveguide for selective feedback. One known design using these liquid crystal waveguides is described in A. S. P. Chang et al., "Tunable external cavity laser with a liquid crystal sub-wavelength resonant grating filter as wavelength-selective mirror", IEEE Photonics Technology Letters, 2007, Vol 19, No. 14. Another known laser design utilizing liquid crystal waveguides is described in US Patent Application Publication 2010/246618 A1 to Sudo et al. and entitled "External resonator-type wavelength tunable laser device". Devices incorporating liquid crystal waveguides, such as Chang et al. and Sudo et al., establish a resonant waveguide in a liquid crystal material having a sub-wavelength grating structure for supporting a wavelength mode perpendicular to the direction of incidence. The resonant mode supported in the waveguide is reflected back into the laser cavity for oscillation. The setting up of a resonant waveguide adds increased fabrication complexity to the device. Further, in these types of devices the tunability is provided by electrically modifying the effective refractive index of the whole liquid crystal material. This analogue control of wavelength through refractive index variation limits the tuning accuracy and renders the devices highly susceptible to variations in material temperature.

A third known wavelength tunable laser incorporates the use of liquid crystal etalons as tunable filter elements. In these devices, a liquid crystal material is placed in the optical path and the refractive index of the material is controlled to define an etalon which supports certain modes. The tunability of liquid crystal etalons is similar in manner to that of the liquid crystal waveguide devices described above. Accordingly, these devices are also highly susceptible to variations in material temperature. Further, in these types of devices, it is difficult to maintain the finesse of an etalon high over long periods of time, primarily due to temperature instability, and the requirement that the transmissive resonance must be double passed within the optical cavity of the laser.

Recent suggestions for increasing transmission data rates in optical systems propose transmitting multiple carrier signals per channel. Many suggested techniques for achieving this require each channel carrier to be coherent in phase in order to be properly detected and decoded. One particular method used for achieving this coherent, multi-carrier transmission is to spectrally carve pulses out of a continuous wave signal. This method maintains the coherent phase relationship but at the expense of a large loss in optical signal power.

Other methods for producing coherent, multi-carrier data transmission include mode-locking a number of frequency separated signals oscillating in a laser cavity. However, these techniques are limited to low repetition rates as they utilize gain switching modulation and the mode-locked frequencies are limited to those frequencies spatially supported by the laser cavity.

There is a need in the art for improved tunable optical filters and wavelength tunable lasers.

SUMMARY OF THE INVENTION

It is an object of the invention, in its preferred form to provide an improved or alternative tunable optical filter and wavelength tunable laser.

According to a first aspect of the present disclosure, there is provided a tunable optical filter for filtering an input optical signal, the filter comprising a plurality of layers, including:

a diffractive layer for angularly diffracting the optical signal into a plurality of constituent wavelength components according to wavelength; and a phase manipulation layer including an array of independently addressable pixels, each pixel configured for receiving a drive signal and, in response to the drive signal, selectively applying a phase modification to the wavelength components incident onto the pixel to directionally steer the wavelength components along respective angularly separated paths;

at least one path defining a collection path being a path wherein the corresponding wavelength component is able to be collected and processed by an optical system.

The diffractive layer preferably includes an electrode layer for applying an independent electric voltage drive signal to each pixel. The electrode layer preferably includes:

an array of electrically isolated regions, each configured for applying a drive signal to a corresponding pixel; and a diffractive grating structure etched across the regions.

The phase manipulation layer is preferably configured for independently controlling the wavelength and phase of the wavelength components.

In one embodiment, the filter preferably includes a refractive prism layer disposed between the diffractive layer and the phase manipulation layer, wherein the refractive prism layer is configured to:

receive the input optical signal;

refract the signal onto the phase manipulation layer at a first predefined angle; and passively guide the phase manipulated signal onto the diffractive layer at a second predefined angle to selectively steer at least one wavelength component along a collection path to be collected and processed by an optical system.

The pixels are preferably driven to define a periodic phase profile for selectively defining the angle at which the optical signal is steered. The phase profile preferably includes periodic phase resets and the position of the resets controls the phase of the wavelength components. The periodicity of the phase profile controls the wavelength of the component transmitted along the collection path.

In one embodiment, the pixels are preferably driven to define a phase profile having two or more superimposed diffractive phase functions for directionally steering two or more wavelength components along the collection path.

The pixels are preferably digitally electrically driven to provide substantially continuous wavelength tuning over a predetermined wavelength range. The pixels are preferably digitally electrically driven to provide substantially continuous power attenuation control over a predetermined wavelength range.

The array of independently addressable pixels is preferably two-dimensional having a first dimension and a perpendicular second dimension. The pixels are preferably configured to directionally steer the wavelength components along paths in one or both of the first dimension and the second dimension. Rows of pixels in the first dimension are driven with first phase profiles to directionally steer the wavelength components along paths in the first dimension and columns of pixels in the second dimension are driven with second phase profiles to selectively attenuate specific wavelength components.

In one embodiment, the grating structure is preferably periodic. In another embodiment, the grating structure is preferably aperiodic. The grating is preferably configured for operation in the Littrow configuration.

The phase manipulating pixels are preferably liquid crystals. In another embodiment, the phase manipulating pixels are preferably micro-electromechanical (MEMS) mirror elements. In a further embodiment, the phase manipulating pixels are preferably piezo-electric transducer elements.

The input optical signal is preferably incident onto the phase manipulation layer at an angle with respect to its normal direction. The input optical signal is preferably incident onto the phase manipulation layer at an angle of greater than 45° to its normal direction.

In accordance with a second aspect of the disclosure, there is provided a wavelength tunable laser having a cavity for resonantly supporting oscillation of optical signals and a tunable optical filter according to the first aspect for allowing wavelength components propagating along the collection path to oscillate within the cavity while restricting wavelength components propagating along other paths from oscillating within the cavity.

The tunable optical filter is preferably external to the laser cavity.

In accordance with a third aspect of the present disclosure, there is provided a tunable optical filter for receiving an input optical signal having a plurality of wavelength components, filtering the input optical signal and outputting a filtered optical signal having a subset of the wavelength components, the filter including a phase manipulation element configured for simultaneously and independently controlling both the phase and center wavelength of the filtered optical signal.

The phase manipulation element preferably includes an array of independently drivable phase manipulating cells configured to selectively define a periodic phase profile having a predetermined periodicity and lateral position.

The phase of the filtered optical signal is preferably controlled by the lateral position of the phase profile.

The wavelength of the filtered optical signal is preferably controlled by the periodicity of the phase profile.

In accordance with a fourth aspect of the present disclosure, there is provided a wavelength tunable laser including:

a cavity for supporting oscillation of an optical signal;

a gain element for amplifying the optical signal oscillating in the cavity;

a tunable optical filter including:

a diffractive layer for angularly diffracting the optical signal into a plurality of constituent wavelength components according to wavelength; and a phase manipulation layer including a two-dimensional array of independently addressable pixels, each pixel configured for receiving a drive signal and, in response to the drive signal, selectively modifying the phase of the wavelength components incident onto each pixel to directionally steer the components along respective angularly separated paths;

wherein only wavelength components propagating along predetermined paths are resonantly supported in the cavity.

The wavelength tunable laser preferably further includes a phase locking element for locking the relative phase between wavelength components resonantly supported in the cavity.

The wavelength tunable laser preferably further includes an optical separator for spatially separating components of the optical signal for incidence onto different regions of the phase manipulation layer. The optical separator preferably includes:

at least one splitting element for splitting the optical signal into two or more signal components;

an optical delay element for introducing a relative phase difference between the signal components; and an optical power element for imaging the signal components together at an imaging plane to produce interference fringes at physical locations along the plane that depend upon the relative phase difference between the signal components.

In accordance with a fifth aspect of the present disclosure, there is provided a mode-locked tunable laser including:

a cavity for supporting oscillation of an optical signal;

a gain element for amplifying the optical signal oscillating in the cavity;

a gain modulation element for selectively modulating the gain of the optical signal;

a wavelength selective phase manipulation element configured for selecting specific wavelength components to be supported in the cavity and for independently controlling the phase of the wavelength components.

Preferably the cavity is configured to support a plurality of spatially separated and spectrally distinct wavelength components and the wavelength selective phase manipulation element is configured to individually manipulate the phase of the different wavelength components to simultaneously mode-lock each component.

In accordance with a sixth aspect of the present disclosure, there is provided an optical filter including:

at least one input port for receiving an optical signal having wavelength components each having a first phase status;

separation capability for separating the optical signal into its wavelength components and projecting them onto a variable grating structure;

a variable grating structure unit including an array of variable refractive index elements able to be set to a series of levels, said unit adapted to modify the phase or direction of projection of at least a subset of the wavelength components; and an output port for collecting a specific output including one or more modified wavelength components.

BRIEF DESCRIPTION OF THE DRAWINGS

Embodiments of the invention will now be described, by way of example only, with reference to the accompanying drawings in which.

DETAILED DESCRIPTION

Figure 1:
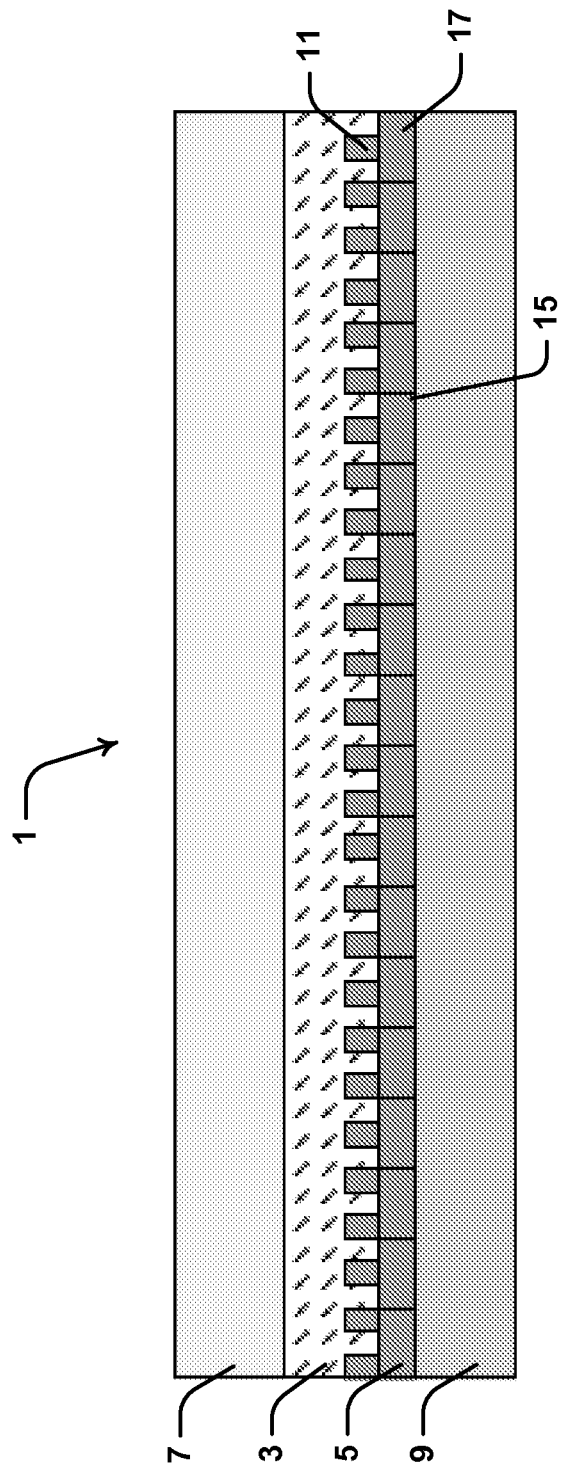
FIG. 1 is a schematic cross sectional view of a first embodiment tunable optical filter.
Figure 2:
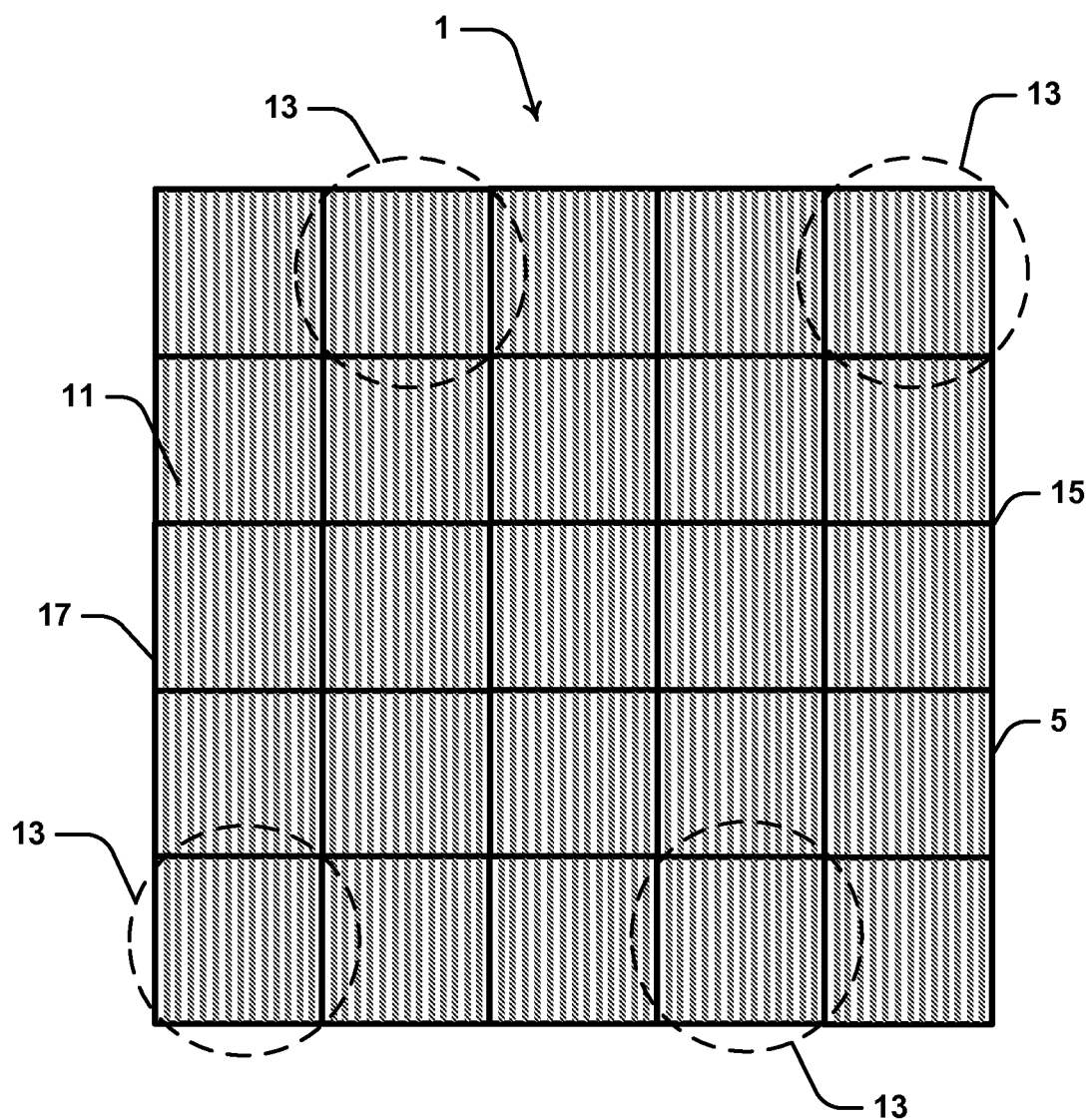
FIG. 2 is a schematic plan view of the tunable optical filter of FIG. 1.

Described herein is a tunable optical filter 1 for filtering an input optical signal. Referring initially to FIG. 1, there is illustrated a cross sectional view of the filter, which comprises a unitary element having a number of layers including a phase manipulation layer in the form of a liquid crystal material 3 and a diffractive layer in the form of a diffraction grating 5 sandwiched between an upper glass layer 7 and lower silicon layer 9. Referring now to FIG. 2, grating 5 includes a grating structure 11 etched therein for angularly diffracting the optical signal into a plurality of constituent wavelength components according to wavelength. Material 3 includes a two-dimensional array of independently addressable substantially square-shaped pixels 13, each pixel is configured for receiving a drive signal and, in response to the drive signal, selectively modifying the phase of the wavelength components incident onto each pixel to directionally steer the wavelength components along respective angularly separated paths. In other embodiments, material 3 includes only a single dimension of independently addressable pixels 13. By suitable steering of the wavelength components, at least one wavelength component is selected to be coupled along a predetermined collection path to an optical system such as a laser cavity.

General Filter Operation in the Context of a Laser

In the present disclosure, filter 1 will be described for use as a wavelength selective element in a laser system. In particular, filter 1 is described as an external selective feedback element for selecting a certain wavelength component or components to couple back into a laser cavity, for example, a diode laser. Filter 1 is able to be combined to an existing laser to establish an external cavity type laser system with selected wavelength components fed back into the laser cavity by filter 1. In another embodiment, filter 1 is able to be situated in the optical path within a predefined laser cavity to select a certain wavelength component or components to be retained within the cavity while attenuating other wavelength components. In both embodiments, filter 1 functions as a selective element of a wavelength tunable laser. While filter 1 will be described with specific reference to this application, it will be appreciated that filter 1 will find applications in other fields or areas of use.

Returning to FIG. 1, the optical filter described herein relates to a liquid crystal on silicon (LCOS) type device wherein the pixels 13 are liquid crystals driven independently by electrically isolated regions 15 of an electrode 17. This type of device operates in a reflective type operation wherein output filtered signals are reflected from filter 1 and counter propagate with the incident signals. However, it will be appreciated that the filter described herein is able to be realized in a transmission type operation where output filtered signals are transmitted through the filter and propagate away from the incident signals.

The pixels are preferably square-shaped having dimensions of approximately 10 microns. However, in other embodiments, other pixel sizes and shapes are used. A grating structure 11 is etched into electrode 17 forming the diffraction grating 5. Grating 5 preferably has a period of about 1,700 lines per millimeter. However, in other embodiments, gratings with other dimensions are used. Electrode 17 is formed of aluminum. However, in other embodiments, electrode 17 is formed of other conductive materials such as other metals and conductive polymers. As illustrated, layer 5 overlaps with layer 3, with the grating structure protruding into the liquid crystal material.

As shown in FIGS. 1 and 2, grating structure 11 is periodic in a first dimension being a dimension in which the wavelength components are angularly separated. However, in other embodiments, grating structure 11 is only partially periodic or aperiodic. Further, in some embodiments, grating structure 11 includes a periodic or partially periodic structure that extends in two laterally orthogonal dimensions. In one particular embodiment, the periodicity of the grating structure is different in the two dimensions. In another particular embodiment, the periodicity of the grating structure is the same in the two dimensions.

Figure 3:
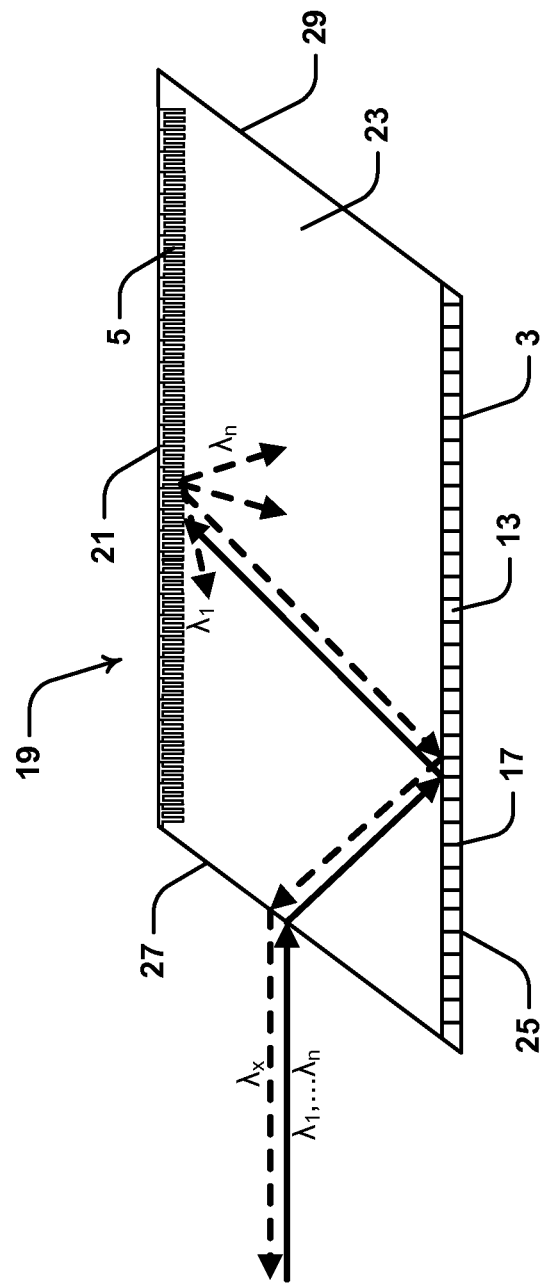
FIG. 3 is side view of a second embodiment tunable optical filter.

Referring now to FIG. 3, there is illustrated a second embodiment filter 19 wherein corresponding features of filter 1 are designated by the same reference numerals. In filter 19, grating structure 11 is not etched into pixels 13 of liquid crystal material 3 but is disposed on a first side 21 of an optical prism element 23 with liquid crystal material 3 disposed on a second side 25 opposite and parallel to side 21. Prism is rhomboid in shape having parallel angled faces 27 and 29 extending between opposing sides 21 and 25. The functionally of filter 19 is substantially similar to filter 1. However, in operation, an optical signal is incident at an angle onto face 27 of prism 23, which is refracted onto material 3. The signal is then reflected through prism 23 to grating 5, where the signal is diffracted into constituent wavelength components. The components are reflected and propagate back through filter 19 along predetermined paths. Depending on the particular trajectory of the path, the wavelength component may be coupled along a collection path back into the laser cavity or coupled along other paths out of the cavity.

Pixels 13 of material 3 are independently electrically driven by the respective regions 15 to introduce a relative phase retardation to the optical signal incident on each pixel. Applying drive signals of different voltage to separate pixels introduces a relative phase difference between the local wavefront of the optical signal incident onto the respective pixels. While pixels 13 are illustrated as square-shaped regions, it will be appreciated that in other embodiments, pixels 13 have other shapes and are disposed in different arrangements or arrays.

Figure 4:
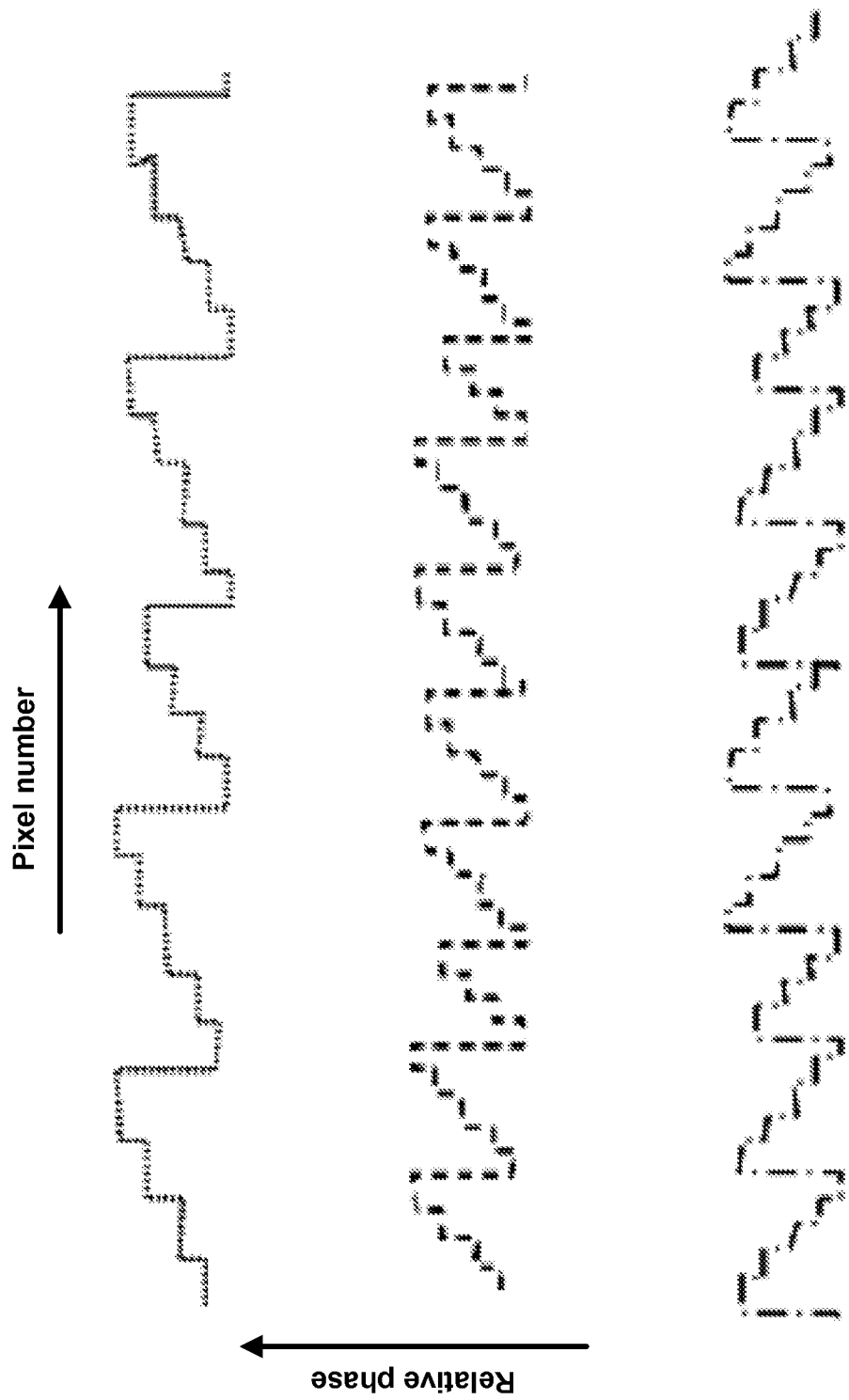
FIG. 4 illustrates three example periodic phase profiles defined by the pixels of liquid crystal material in the tunable optical filter.

The pixels are driven to define a periodic phase profile for selectively defining the angles at which the diffracted wavelength components are steered. Referring to FIG. 4, there are illustrated three example phase profiles, shown as relative phase retardation as a function of pixel number across the liquid crystal material 3. In practice, pixels 13 are digitally electrically driven at a number of phase levels between 0 and $2\pi$ to define various periodic profiles, such as those shown in FIG. 4. The digital driving of pixels 13 allows for the generation of a wide range of periodic phase profiles to thereby provide substantially continuous wavelength tuning over a predetermined wavelength range.

In other embodiments, different types of spatial light modulator devices are used, including transmissive liquid crystal modulators, micro-electromechanical mirror (MEMS) based modulators and 2-dimensional piezoelectric transducer arrays. All of these devices have independently drivable pixels and are capable of producing periodic phase profiles. In some embodiments, glass layer 7 and silicon layer 9 are not required.

The tunable optical filter is capable of independently controlling both the wavelength and phase of the wavelength components that are output from the filter. To illustrate the phase control, reference is now made to FIG. 5, which illustrates schematically an input signal diffracted off filter 1. This figure illustrates the steering of wavefronts 31 by liquid crystal material 3 only and ignores the individual wavelength selection by grating 5. As illustrated, the phase profiles include periodic ramp structures having a predetermined angle $\theta$ across which a $2\pi$ phase shift occurs. Between phase ramps a phase "reset" occurs where the effective phase delay is reset to zero. The specific angle $\theta$ is selectively variable and defines the steering angle of diffracted output wavefronts 35.

Figure 5:
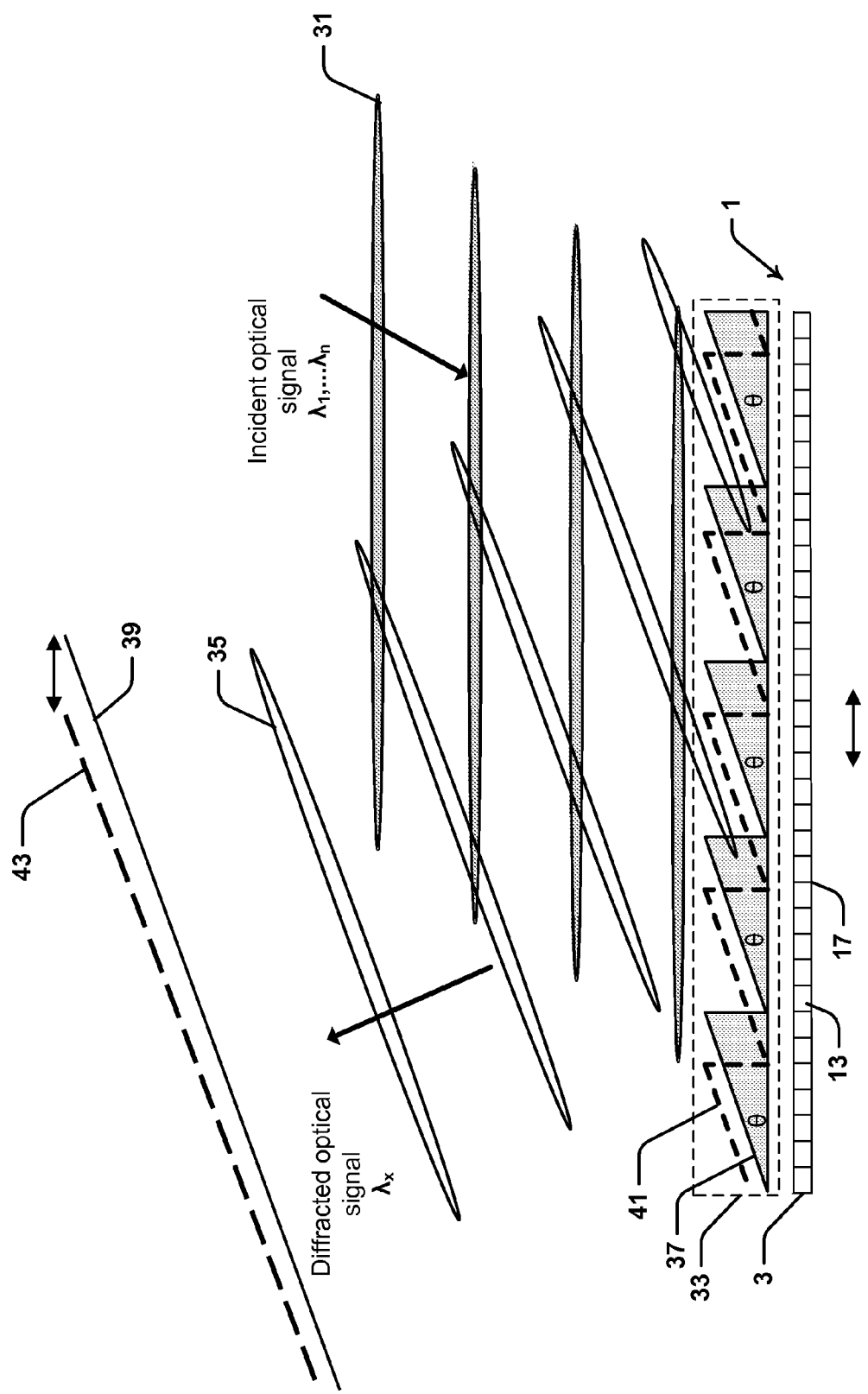
FIG. 5 is a schematic illustration of an input optical wavefront diffracted off the tunable optical filter, ignoring diffraction effects from the diffraction grating.

When the liquid crystals are driven in a first state (designated by solid lines) to define phase profile 37, the diffracted wavefronts 35 for a given wavelength are measured to have a predetermined phase $\phi$ along contour 39. When the liquid crystals are driven in a second state (designated by dashed lines) to define phase profile 41, the position where the wavefronts have that specific phase $\phi$ shifts to contour 43. Therefore, between different driving states (profiles 37 and 41) of the liquid crystals, a different phase is measured at line 39. That is, by laterally shifting or translating the phase profile of the liquid crystals in a first dimension, as shown in FIG. 5, the phase of a diffracted wavelength signal measured at a fixed point is changed between 0 and $2\pi$ radians. Therefore, filter 1 can be used to control the phase of output optical signals.

Figure 6:
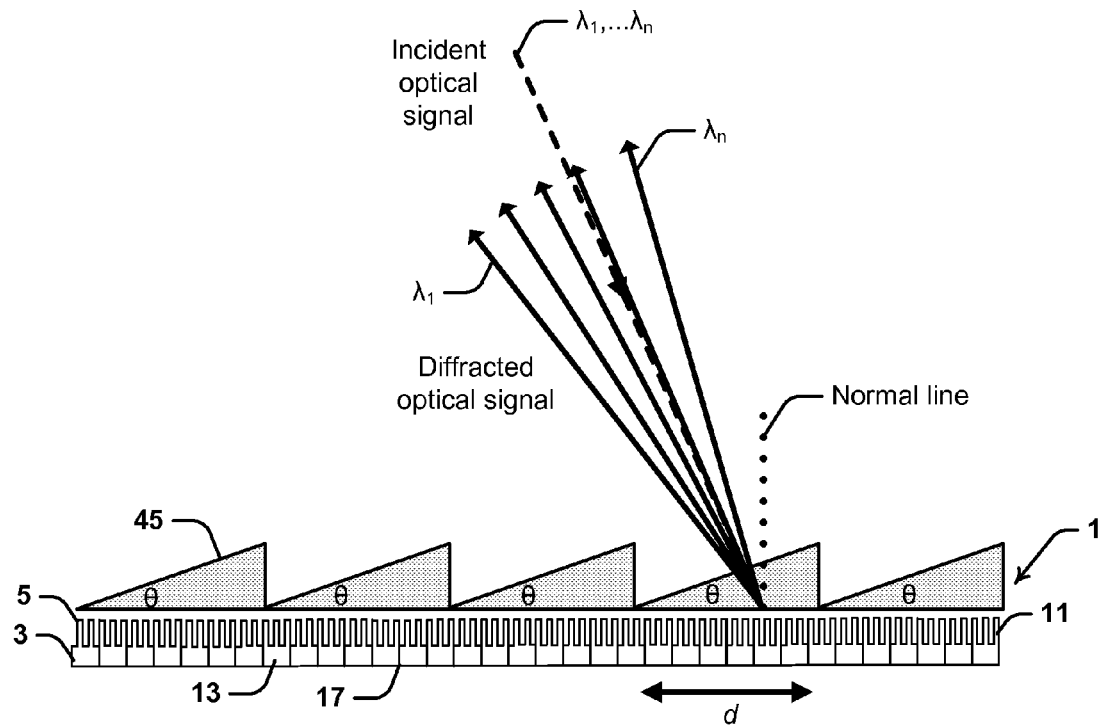
FIG. 6 is a schematic illustration of optical signals diffracted off the tunable optical filter when the pixels of the liquid crystal material are driven to define a phase profile having a long periodicity.
Figure 7:
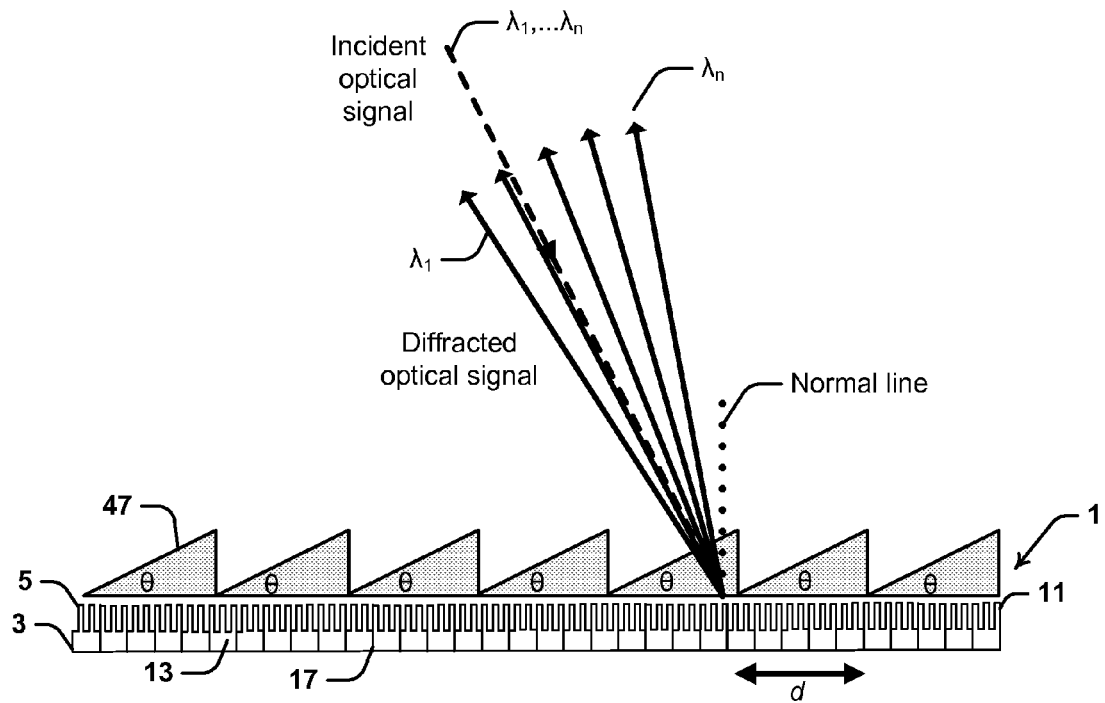
FIG. 7 is a schematic illustration of optical signals diffracted off the tunable optical filter when the pixels of the liquid crystal material are driven to define a phase profile having a short periodicity.

To illustrate the wavelength control of filter 1, reference is now made to FIGS. 6 and 7, which illustrate schematically optical signals diffracted off filter 1 when the liquid crystal layer is driven to define phase profiles 45 and 46 having respectively a longer periodicity (FIG. 6) and a shorter periodicity (FIG. 7). As with the lateral position variation described in relation to FIG. 5, the periodicity of the phase profile can be varied by driving pixels 13 in a different state. Variation of the periodicity changes the wavelength coupled along a predetermined output path. In the Littrow configuration, the output path is the same as the input path. Decreasing the phase profile period couples signals of smaller wavelength along the predetermined output path. Similarly, increasing the period couples signals of larger wavelength along the predetermined path. Therefore, varying the periodicity of the phase profile selectively varies the wavelength to be coupled from filter 1.

The optical signals are preferably incident onto liquid crystal material 3 at an angle with respect to the normal. This angled geometry allows for a larger surface area of a beam to be incident onto the liquid crystal material 3 for a given optical beam size. The larger effective surface area allows the beam to cover more pixels and hence a larger number of phase ramps and phase resets. This translates to a greater wavelength tuning range as a larger range of profile periodicities can be constructed. Particularly, for Littrow angles of greater than about 45° to the normal of material 3, substantially continuous wavelength tuning over the C-band is possible.

To achieve this angled incidence, in one embodiment the filter includes a prism element for diffracting the incident optical signal from an optical axis onto liquid crystal material 3 at a predetermined angle. Use of such a prism element will be described below in relation to the tunable laser application. In another embodiment the filter is oriented at an angle relative to the optical axis of the incident optical signal. In some embodiments, the filter is selectively rotatable to vary the angle in which the filter receives the optical signal.

Varying lateral position and periodicity of the phase profile is performed electronically and independently. Therefore, both the phase and wavelength of output wavelength components are able to be controlled and varied independently of one another in filter 1. This independent phase control has particular applications in more accurately controlling the phase of mode-locked signals in a pulsed output laser.

Grating 5 is preferably configured for operation in the Littrow configuration. In this configuration, the desired output collection path is the same as the incident optical path so that a wavelength component directed back along the incident path is coupled efficiently back into the laser cavity or other optical system.

Figure 8:
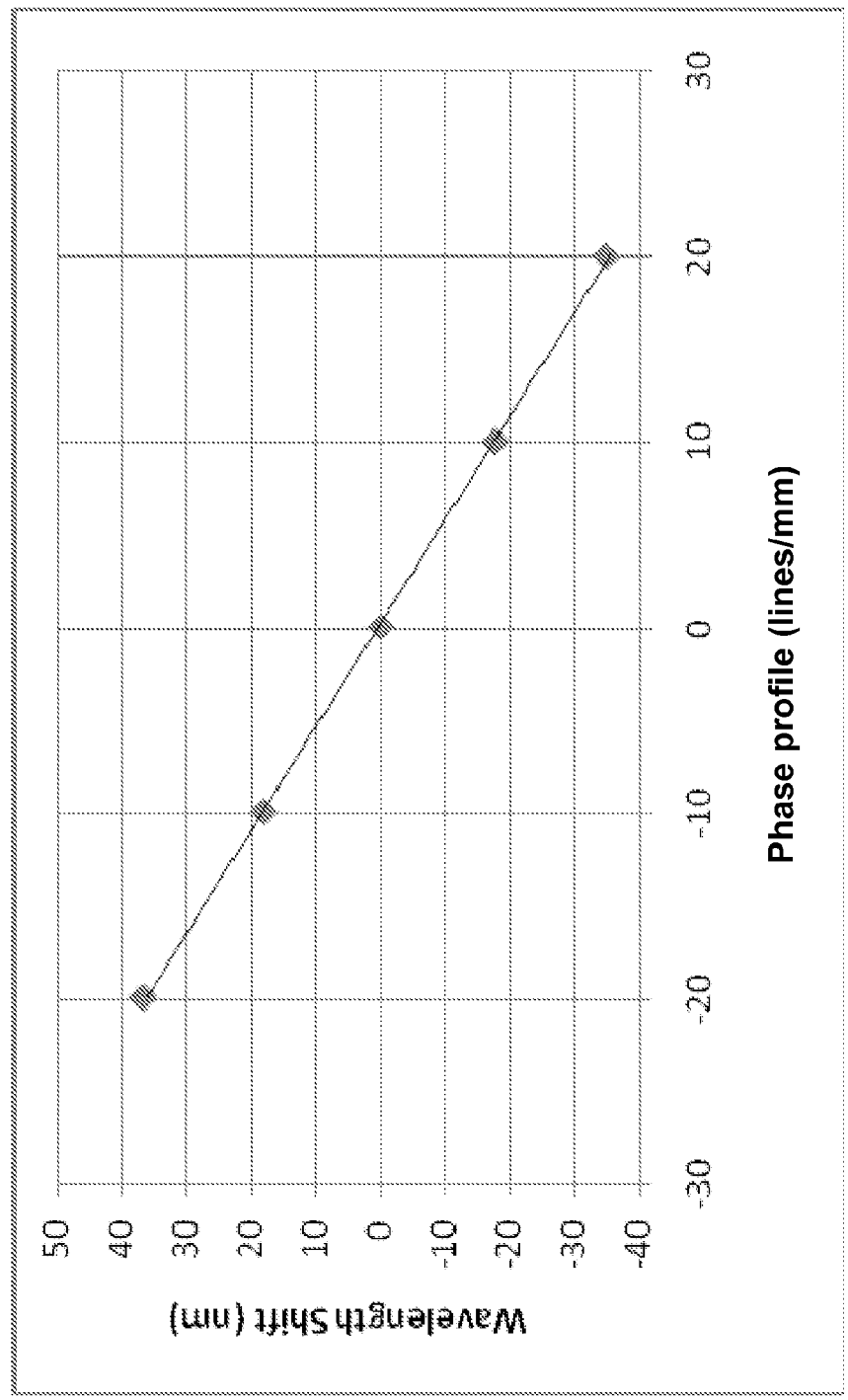
FIG. 8 is a plot of wavelength shift, relative to an initial output wavelength, as a function of the number of phase resets or lines per millimeter defined in the liquid crystal phase profile for a simulated tunable wavelength filter.
Figure 9:
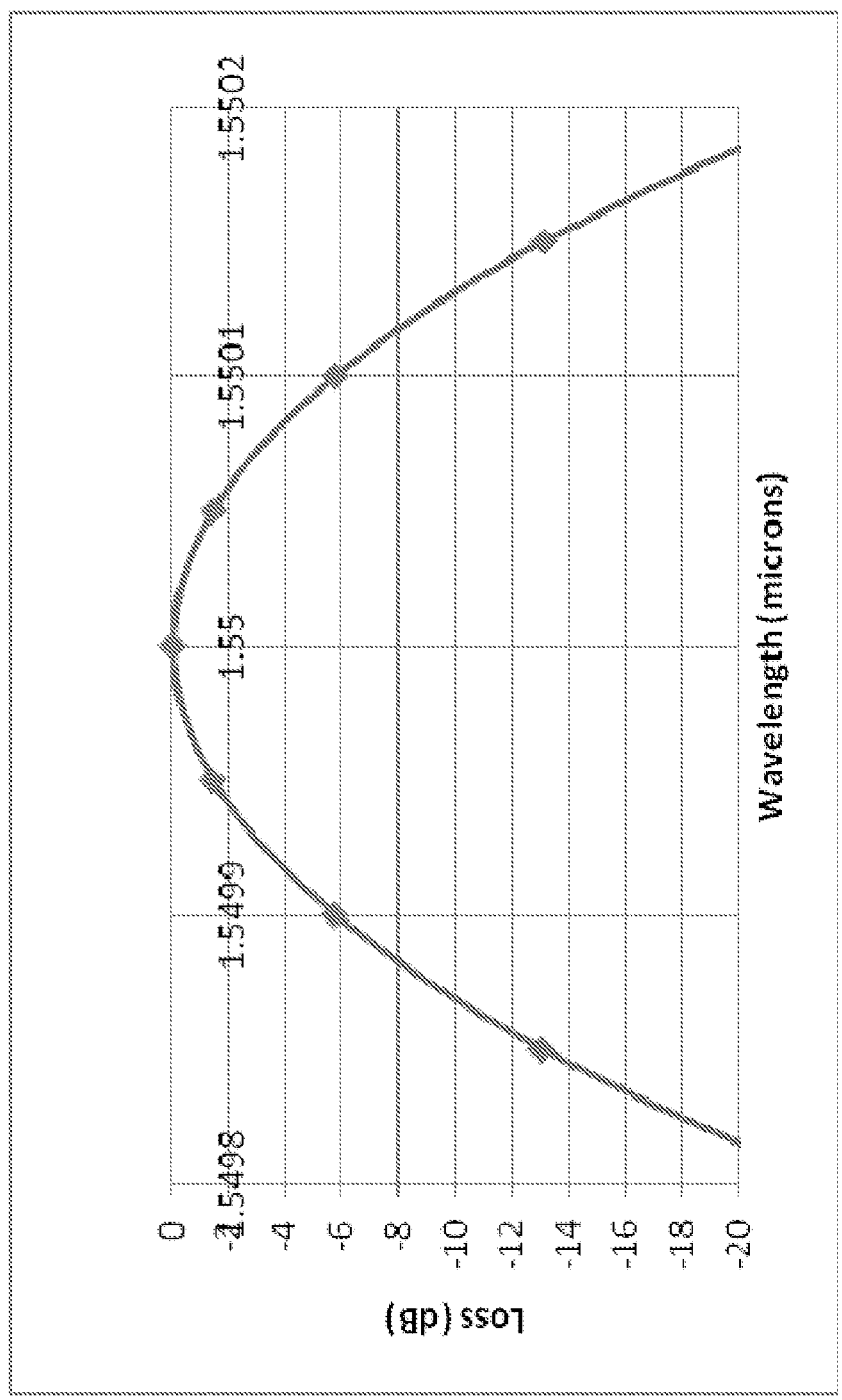
FIG. 9 is a graph of simulated fiber coupling loss as a function of wavelength for a flat liquid crystal phase profile for a simulated tunable wavelength filter.
Figure 10:
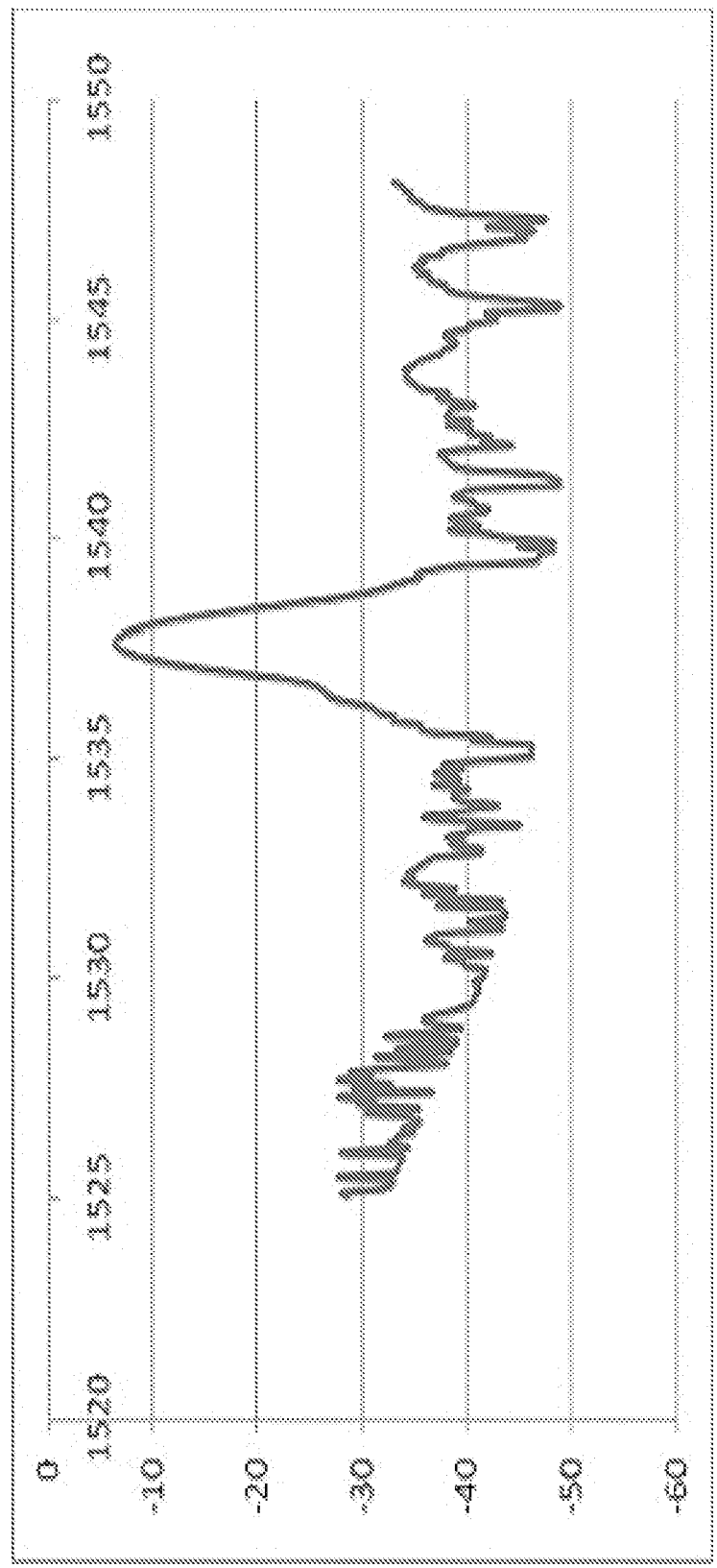
FIG. 10 is a plot of an output filtered spectrum for a simulated tunable wavelength filter.

To illustrate example performance of a tunable optical filter, reference is made to FIGS. 8, 9 and 10, which illustrate results of a simulated wavelength tunable filter. FIG. 8 illustrates the simulated wavelength shift, relative to an initial output wavelength, as a function of phase resets or lines per millimeter of the phase profile established across pixels 13 of liquid crystal material 3. A negative value of the x-axis indicates a reversal in the orientation of the periodic phase ramps defining the profile (see FIGS. 6 and 7). FIG. 8 indicates that by varying the phase profile across liquid crystal material 3, the observed wavelength is tuned across a range of about ±35 nm.

Referring to FIG. 9, there is illustrated a graph of simulated fiber coupling loss as a function of wavelength for a flat phase profile (0 lines/mm) established across liquid crystal material 3. FIG. 9 essentially illustrates the filter performance profile of the simulated tunable optical filter when driven with the particular phase profile. This particular filter is configured to operate at a wavelength of 1.55 microns.

Referring to FIG. 10, there is illustrated an example spectrum of the output filter profile from a simulated optical filter constructed in accordance with the description above. The simulated filter utilized an LCOS device having 100 square pixels of 14 micron width and an etched diffraction grating having a periodicity of 1,650 lines per mm. In the spectrum, the central peak represents the selected wavelength component coupled back along the predetermined collection path. Other wavelength components are coupled along other paths and are hence filtered from the optical system.

Example Application

A Wavelength Tunable Laser

Figure 11:
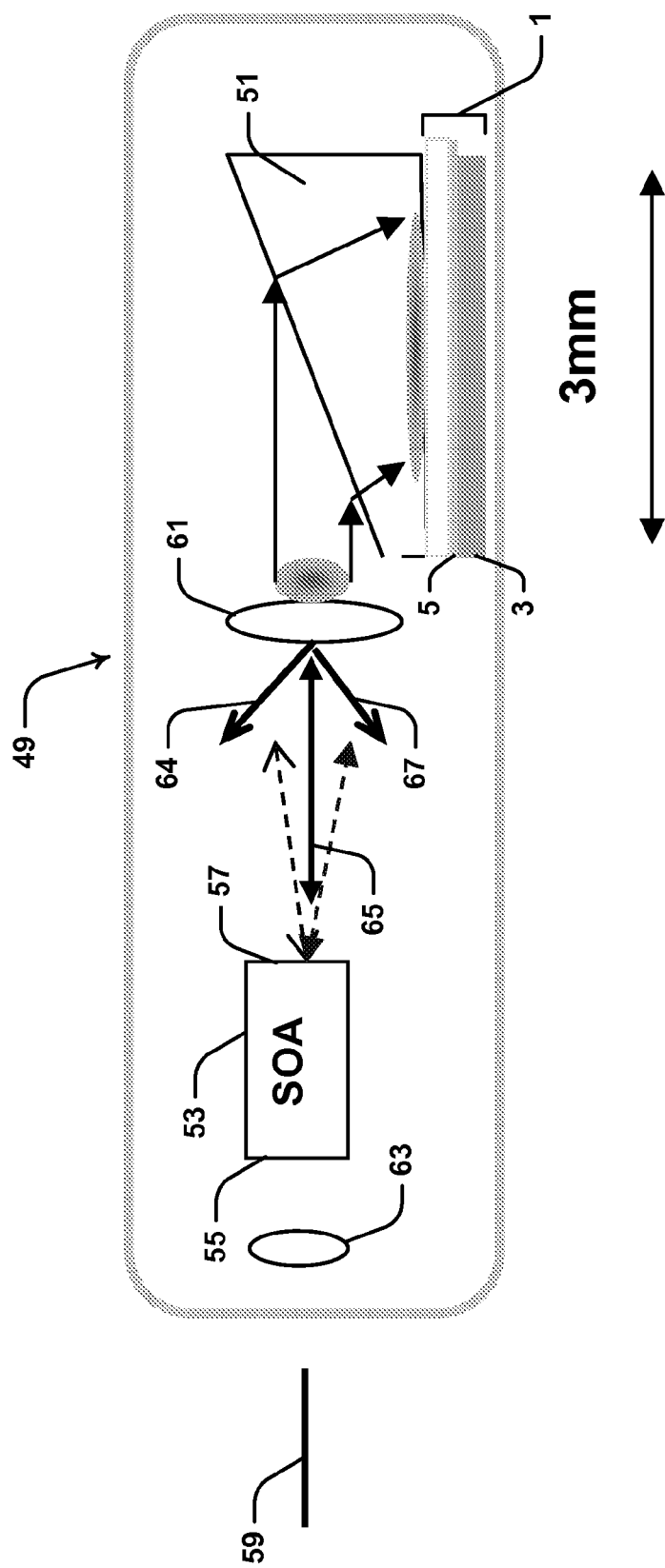
FIG. 11 is a schematic illustration of a first embodiment external cavity laser system incorporating a tunable optical filter according to the first embodiment.

Referring now to FIG. 11, there is illustrated schematically an example implementation of an external cavity laser system 49 incorporating filter 1 as a wavelength selective element. The conventional laser cavity is defined horizontally while filter 1 is positioned to receive optical signals vertically. A substantially triangular coupling prism 51 is mounted to filter 1 to couple the signals from horizontal propagation in the cavity to vertical incidence onto filter 1. This configuration is practical to implement where the optical elements and filter 1 are able to be mounted to a common optical base or platform (not shown). Further, prism 51 allows for angled incidence of the optical signal onto filter 1 to enhance the tuning range of the filter as described above.

Laser system 49 includes a laser resonator in the form of a semiconductor optical amplifier (SOA) 53. The SOA is of a conventional design, known in the art, formed of semiconductor materials such as GaAs/AlGaAs, InP/InGaAs and having a highly reflective end face 55 and a low reflective end face 57. End face 57 includes an antireflective coating and is angled with respect to the optical axis to minimize back reflection within SOA 53. However, in other embodiments, end face 57 is not angled or coated but has a relatively high transmittance such that back reflections within SOA 53 are small.

End face 53 is configured for coupling light between SOA 53 and filter 1, while end face 55 couples light from laser system 49 as the laser output beam 59. Lens 61 is situated between SOA 53 and filter 1 to collimate the light output from SOA 53 onto prism 51. Lens 63 collimates or manipulates spatial profile of the output optical beam.

In use, SOA 53 generates an optical signal having a predetermined gain spectrum, with certain spectral modes being supported in the cavity defined along an optical path between end face 55 and filter 1. Absent any active driving of pixels 13 of filter 1, the optical signal propagating in the cavity is diffracted by grating 5 and constituent wavelength components are angularly dispersed according to wavelength. These wavelength components travel along angularly separated paths (e.g. paths 64, 65 and 67), as shown in FIG. 11. Paths aligned with the optical axis, e.g. path 65 couple wavelength components back into the laser cavity and paths not aligned with the optical axis, e.g. paths 64 and 67, couple the wavelength components out of the laser cavity.

Electrically driving pixels 13 to apply predefined phase profiles allows the angles of these dispersed paths to be controlled, thereby controlling the trajectory of each specific wavelength component. By applying an appropriate phase profile, it is possible to select the specific wavelength component or components to be coupled back into SOA 53 and thereby select the particular wavelength supported by the laser cavity for laser output. Appropriate steering of the remaining wavelength components couples them out of resonant circulation in the laser system with little or no power at these wavelengths transmitted in output beam 59.

Therefore, the output wavelength of the laser can be digitally selected by the drive signal of the pixels. By selective appropriate properties of grating 5 and the cavity length, the linewidth of laser system 49 is able to be made very narrow, for example on the order of 100 KHz. By selecting appropriate phase profiles, the output wavelength can be tuned substantially continuously across a wide spectral range including the L band (about 1570 nm to 1625 nm) and C band (about 1530 nm to 1570 nm) telecommunications bands.

Figure 12:
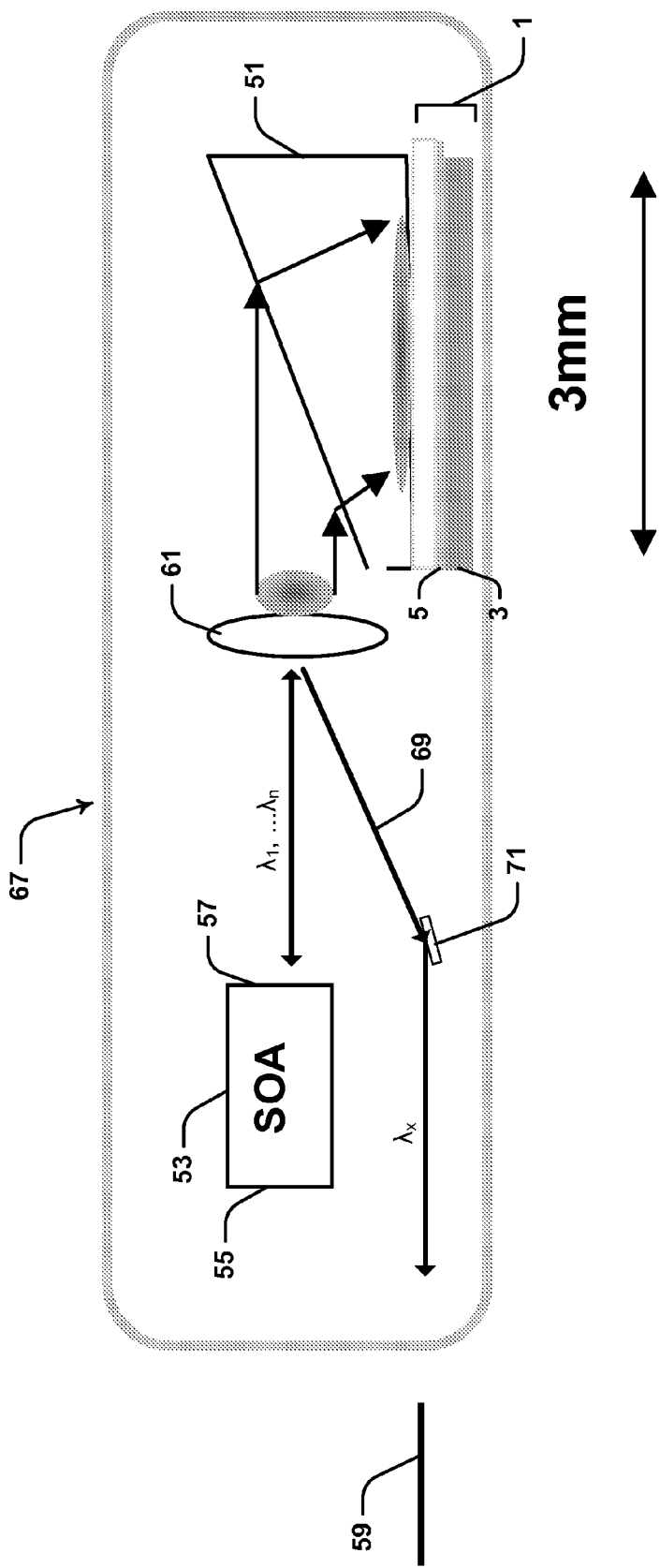
FIG. 12 is a schematic illustration of a second embodiment external cavity laser system incorporating a tunable optical filter according to the first embodiment.

Referring now to FIG. 12 there is illustrated an embodiment laser system 67, wherein corresponding features of system 49 are given the same reference numerals. In this system, end face 55 is substantially perfectly reflecting and filter 1 is used to define output optical beam 59 by steering one or more predetermined wavelength components ($\lambda_x$) along a collection path 69 out of the system. Optical elements such as mirror 71 are used to define path 69, which produces laser output beam 59. It will be appreciated that, in other embodiments, collection path 69 is able to be defined in any number of directions, angles or orientations.

In other embodiments, laser resonators other than semiconductor optical amplifiers are used. Further, in some embodiments, filter 1 is able to be incorporated into the normal cavity of the laser, either during or after initial manufacture of the laser.

The abovementioned wavelength and phase selective operation of filter 1 is performed by the predetermined driving of the pixels 13 in a first dimension. This dimension is the same dimension as the spatial dispersion of the wavelength components by grating 5. As liquid crystal material 3 includes a two-dimensional array of pixels, it is possible to use the second dimension of pixels for steering selected wavelength components in the second dimension that is orthogonal to the first dimension. This additional steering flexibility has applications for selectively filtering out undesired wavelength components and also for selectively attenuating wavelength components.

In the context of filtering, steering wavelength components in the second dimension allows selected wavelength components to be coupled away from the lasing optical path and/or out of the resonant laser cavity. This sharpens the filter profile to produce a laser output having a narrower linewidth. Steering in the second dimension also provides gain control in the sense that wavelength components can be selectively attenuated without coupling them out of the laser. Pixels 13 are able to be driven to apply attenuation profiles in the second dimension to selected ones of the wavelength components. An example of such an attenuation profile is a sinusoidal relative phase profile having a period of 2 pixels. This selective attenuation capability has advantages in providing gain flattening filtering, particularly for use in a multi-carrier laser source where an output signal includes a plurality of spectrally distinct peaks. The application of filter 1 in a multi-carrier laser source will be described in more detail below.

Example Application

Multi-Carrier Mode-Locked Laser

Figure 13:
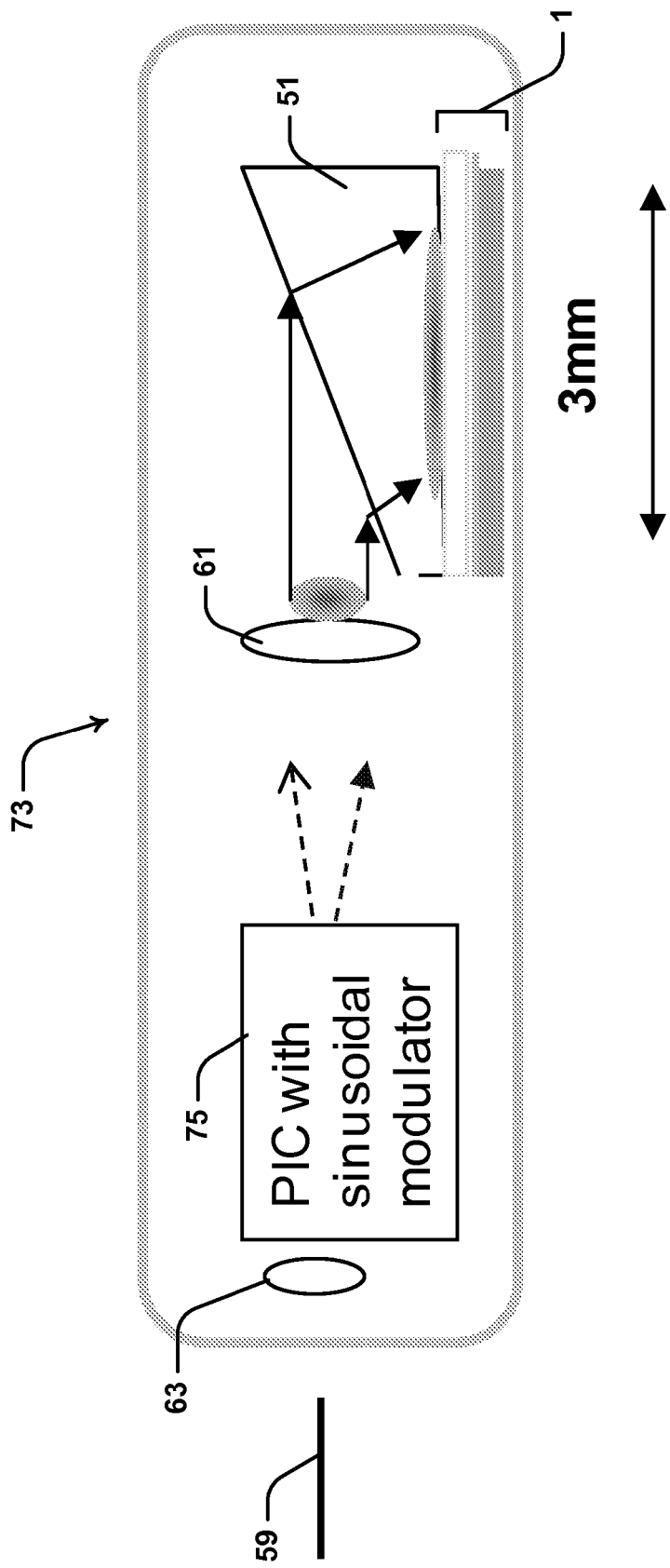
FIG. 13 is a schematic illustration of a multi-carrier mode-locked external cavity laser system incorporating a tunable optical filter according to the first embodiment.

Referring now to FIG. 13, there is illustrated schematically an external cavity, mode-locked laser 73 capable of outputting multiple carriers per channel. Laser 73 includes a laser resonator, in the form of a photonic integrated circuit (PIC) 75, coupled to tunable filter 1. PIC 75 is a device including a number of functional optical modules mounted on a substrate in a similar manner to an electrical integrated circuit. In particular, PIC 75 includes a laser resonator cavity, such as a SOA, and a sinusoidal phase modulator. In other embodiments, separate laser resonators and phase modulators are used. In one particular embodiment, the laser includes a SOA and separate acousto-optic phase-modulator electrically driven to produce a sinusoidal amplitude modulation of the propagating signals.

The phase modulator periodically modulates the phase of the optical signals propagating in the cavity. As is known in the art, modulating the phase at the same frequency as the cavity round trip time allows a laser to enter a mode-locked operation wherein a laser mode periodically constructively interferes to produce periodic output pulses.

In traditional mode-locked lasers, the cavity round trip time, and hence the mode-locking frequency, is set by the cavity length or harmonics of the cavity length. Accordingly, fluctuations in the cavity length, for example, due to temperature changes, cause the mode-locking frequency to vary, making it difficult to maintain mode-locked operation. Further, in multi-carrier lasers, the phase of each wavelength carrier varies differently for a given change in cavity length. Therefore, it is often necessary to closely monitor and control the laser's temperature.

Tunable optical filter 1 provides individual manipulation of the phase of the different carriers in the cavity to allow the mode-locking frequency to be continuously adjustable rather than locked to fixed cavity frequencies. This capability is advantageous as the exact requirements for intra-channel carrier spectral spacing and the number of carriers will generally vary from customer to customer. Further, with elastic transceivers the number of carriers may even vary in response to the particular link conditions. In multi-carrier channel systems, it is often a requirement that the linewidth of the carriers be narrow (on the order 100's of kHz). Implementation of filter 1 in an external cavity system is able to provide outputs within this range of linewidth.

Filter 1 allows constituent wavelength components of an optical signal to be independently phase modulated. Accordingly, by simultaneously coupling more than one component back through the laser cavity, the laser can be made to support several wavelength modes and form a multi-carrier laser system.

Figure 14:
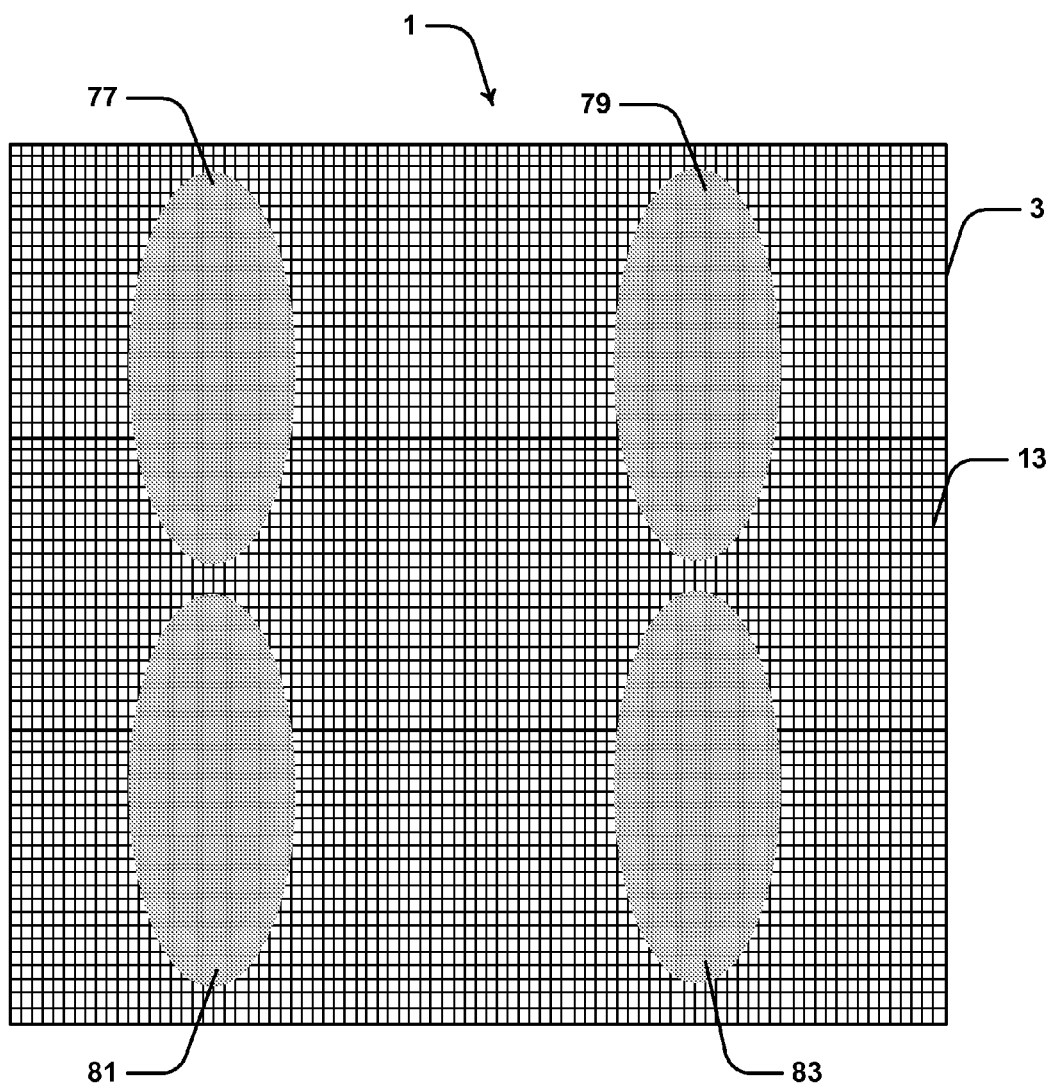
FIG. 14 is a plan view four optical beams incident onto different pixel regions of a tunable optical filter.

As mentioned, filter 1 includes a two-dimensional array of independently controllable pixels 13. By spatially separating different wavelength components oscillating in the cavity, different pixel regions are able to be used to independently manipulate the wavelength and phase of each wavelength component. For example, referring to FIG. 14, there is illustrated a configuration of four wavelength component beams 77, 79, 81 and 83 incident onto different pixel regions of filter 1.

Figure 15:
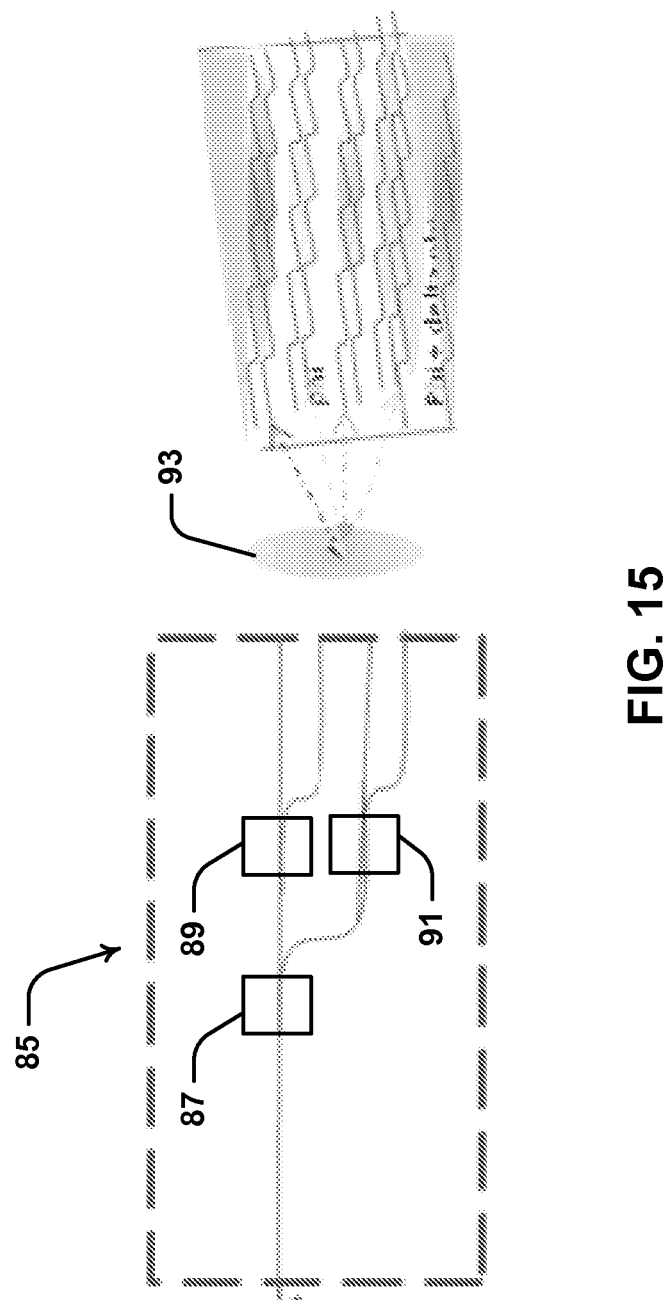
FIG. 15 is a schematic illustration of a variable delay line system configured to spatially separate one optical signal into four vertically spaced optical signals.

In one embodiment, spatial separation of wavelength components is provided by a variable delay line. Referring to FIG. 15, there is illustrated schematically a variable delay line system 85 configured to spatially separate one optical signal into four vertically spaced optical signals within the laser cavity. System 85 includes optical delay elements 87, 89 and 91 for splitting the signal into two signal components and delaying one component relative to the other.

Figure 16:
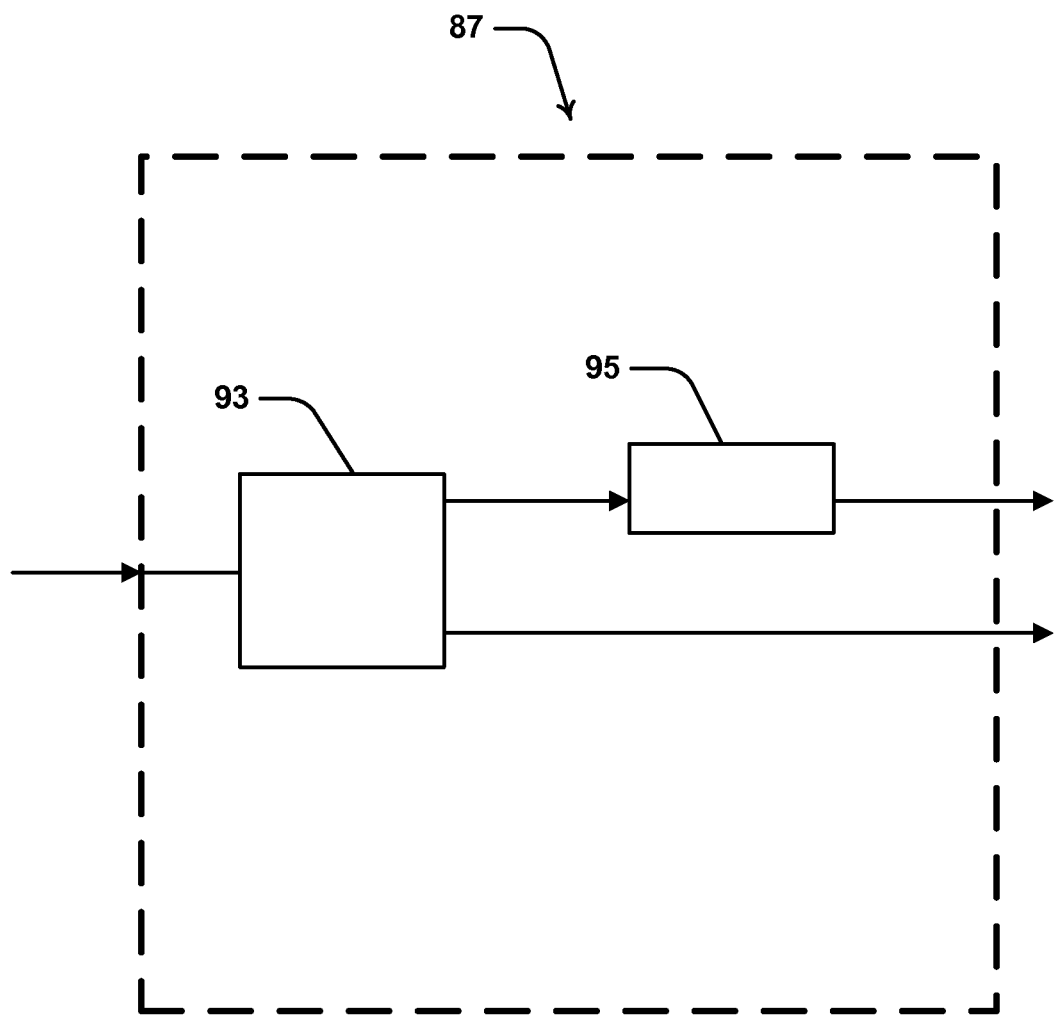
FIG. 16 is a schematic illustration of an example delay element for splitting a signal into two components and delaying one component with respect to the other.

Referring now to FIG. 16, in one embodiment, elements 87, 89 and 91 include a beam splitter 93 and a delay unit 95 having a refractive index greater than air through which one component is passed. Returning to FIG. 15, the two components output from delay element 87 are input to corresponding elements 89 and 91 where the components are again split and delayed with respect to each other. The resulting output is four optical signal components, each being delayed in phase with respect to the next by a predetermined delay. The four components are then passed through a lens 93. In traversing lens 93, the four signal components are focused to a plane and form interference fringes. The relative phase differences form four sets of constructive interference fringes. These fringes are spatially separated and are able to be optically coupled to filter 1 for independent manipulation.

In other embodiments, different optical delay systems are utilized to produce a plurality of optical signals having relative phase delays. Further, in some embodiments, other methods of spatially separating optical signals are incorporated, for example, using mirrors and beam splitters. It will be appreciated that, in various embodiments, the intra-channel carriers are able to be spatially separated in either or both of the first and second dimension defined by the orientation of filter 1.

Returning to FIG. 12, once the signal components are separated, appropriate driving of pixels 13 around each optical beam 77, 79, 81 and 83 allows independent control of the wavelength, phase and attenuation of those signal components. In this manner, the central wavelength of the four optical signals can be set at equal spectral spacing to define a spectral comb channel structure wherein each signal component defines an intra-channel optical carrier.

Figure 17:
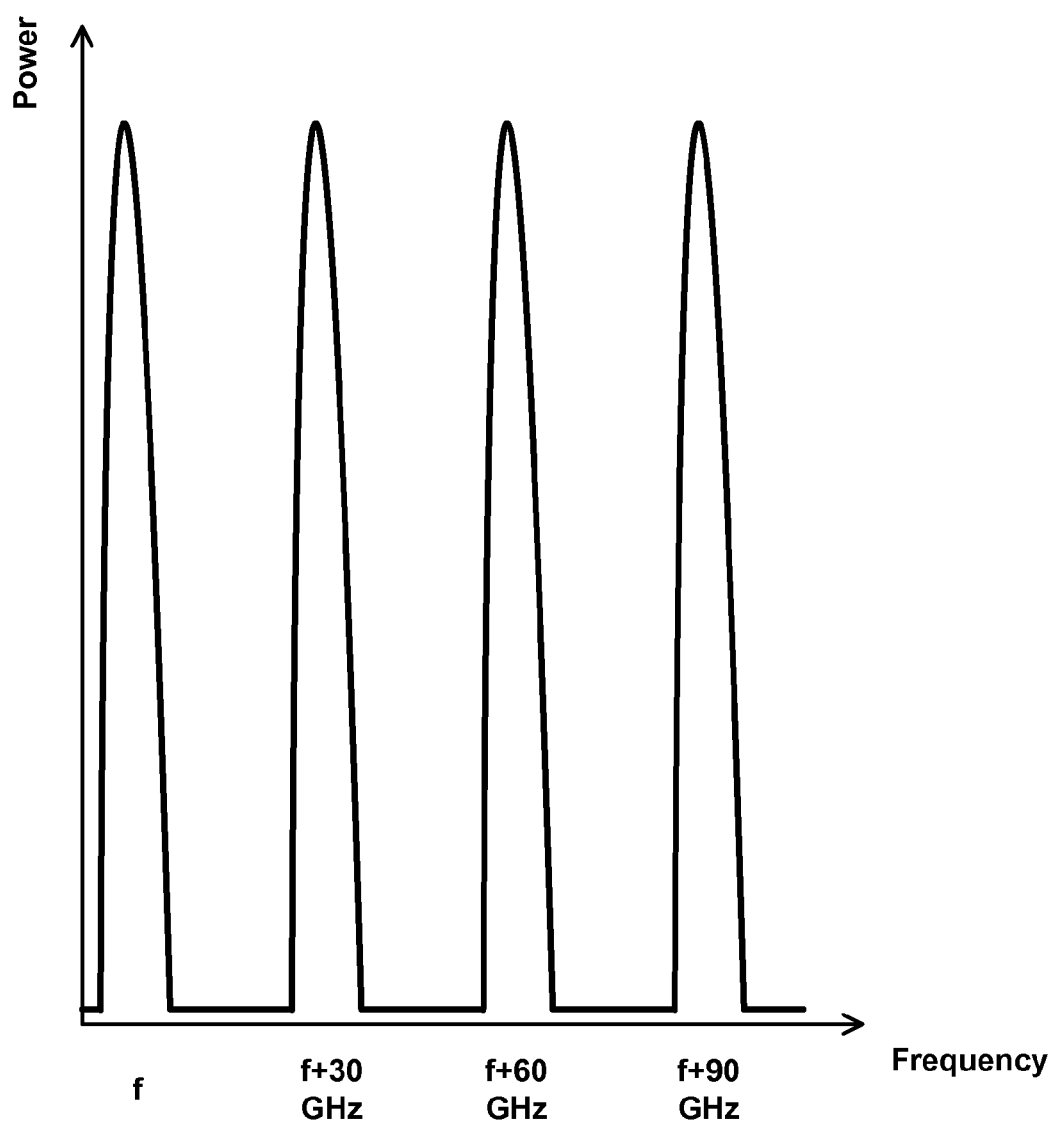
FIG. 17 is an example spectrum of an optical channel having four equally spectrally spaced carrier signals.

Referring now to FIG. 17, an example channel structure is shown, with intra-channel carriers having a frequency spacing of 30 GHz. The phase of each carrier is controlled to support each carrier in the laser cavity in mode-locked operation. It will be appreciated that, in other embodiments, other channel structures are created having different numbers, spacing and/or powers of intra-channel carriers.

In another embodiment, spatial separation of the intra-channel carriers is not required and individual carriers are addressed by applying a phase profile to the pixels 13 that defines two or more superimposed gratings. The parameters of each superimposed grating structure are set to satisfy the phase conditions of each carrier wavelength such that mode-locking conditions are established and maintained. In this embodiment, as well as being able to vary the intra-channel carrier spacing, the actual number of intra-channel carriers can also be defined by configuring the phase profile across liquid crystal material 3 to define different numbers of superimposed grating structures. By way of example, superimposing three periodic phase grating structures on pixels 13 can independently manipulate three intra-channel carriers. Due to signal overlap on the pixels 13, intra-channel carriers defined by this overlap method generally have lower isolation than those defined by spatially separating the carriers in the cavity.

In various embodiments, it will be appreciated that superimposed grating structure profiles can be constructed in both the first and second dimensions across liquid crystal material 3. Further, it will be appreciated that in some embodiments harmonics of particular wavelengths are utilized to define two or more carriers from a single diffraction grating profile.

CONCLUSIONS AND INTERPRETATION

It will be appreciated that the disclosure above provides various significant wavelength tunable optical filters and wavelength tunable lasers.

Filter 1 integrates a diffraction grating with a liquid crystal spatial light modulator to spatially separate wavelength components from an optical signal and independently manipulate the phase of each component to provide advanced optical filtering. The filter finds useful applications in narrow linewidth tunable lasers and particularly in multi-carrier tunable lasers for use in multi-carrier optical communications.

By appropriate driving of the pixels of the liquid crystal spatial light modulator, the relative phase of wavelength components can be accurately controlled to steer the wavefronts over a wide range of angles to provide wavelength selectivity. The filter is able to provide substantially continuous wavelength tuning over the entire optical C and L telecommunications bands.

Filter 1 provides for independently controlling the wavelength and phase of the constituent wavelength components forming the optical signal. The phase of wavelength components output from filter 1 is controlled by the lateral position of the phase resets on the phase profile of the liquid crystal material 3. The particular wavelength component coupled from filter 1 into the laser cavity is controlled by the periodicity of the phase profile of the liquid crystal material 3. Independent phase control of individual wavelength components has applications in mode-locked lasers, particularly in mode-locked multi-carrier lasers wherein a number of coherent spectral pulses are simultaneously supported in the laser cavity.

Driving the pixels in the second dimension of the spatial light modulator provides increased steering functionality and the capability to independently selectively attenuate individual wavelength components. Greater steering functionality has advantages in providing sharper filter cut-offs, while selective attenuation capability has advantages in providing gain flattening filtering.

The design of filter 1 allows it to be applied to existing laser designs as an external feedback element. This allows simple and cheap lasers to be modified to produce continuously wavelength tunable narrow linewidth outputs.

In a mode-locked multi-carrier laser, filter 1 provides individual manipulation of the phase of the different intra-channel carriers in the cavity. This allows the mode-locking frequency to be continuously adjustable across a range of frequencies rather than limited to fixed cavity frequencies. This continuous adjustability is important as the exact requirements for carrier spectral spacing and the number of carriers will vary from customer to customer. Further, with elastic transceivers the number of carriers may even vary in response to the particular link conditions.

In a first embodiment, individual manipulation of multiple intra-channel carriers is possible by spatially separating the carriers in the cavity and individually manipulating the carriers by different regions of pixels on the spatial light modulator. The spatial separation is performed by one or more optical elements external to the spatial light modulator. This method provides strong control of the individual carriers but the number of carriers is set by the particular carrier separation method.

In a second embodiment, the spatial light modulator performs both the carrier separation and individual wavelength component manipulation. Here, the spatial light modulator is driven to define a phase profile indicative of two or more superimposed diffractive structures. The different diffractive properties of each superimposed structure acts to couple a corresponding number of different wavelength components back through the cavity to define a multi-carrier output. This method allows for variation of both the number and spacing of intra-channel carriers.

Throughout this specification, use of the term "optical" in the context of "optical signals" is intended to mean electromagnetic radiation in one or more of the ultra-violet, visible or infrared wavelength regions of the electromagnetic spectrum.

Throughout this specification, use of the term "element" is intended to mean either a single unitary component or a collection of components that combine to perform a specific function or purpose.

Throughout this specification, use of the term "orthogonal" is used to refer to a 90 difference in orientation when expressed in a Jones vector format or in a Cartesian coordinate system. Similarly, reference to a 90° rotation is interpreted to mean a rotation into an orthogonal state.

Reference throughout this specification to "one embodiment", "some embodiments" or "an embodiment" means that a particular feature, structure or characteristic described in connection with the embodiment is included in at least one embodiment of the present invention. Thus, appearances of the phrases "in one embodiment", "in some embodiments" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

As used herein, the term "exemplary" is used in the sense of providing examples, as opposed to indicating quality. That is, an "exemplary embodiment" is an embodiment provided as an example, as opposed to necessarily being an embodiment of exemplary quality.

It should be appreciated that in the above description of exemplary embodiments of the invention, various features of the invention are sometimes grouped together in a single embodiment, FIG., or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

Similarly, it is to be noticed that the term coupled, when used in the claims, should not be interpreted as being limited to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as falling within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. A tunable optical filter for filtering an input optical signal, the filter comprising a plurality of layers, including:

a diffractive layer for angularly diffracting the optical signal into a plurality of constituent wavelength components according to wavelength; and a phase manipulation layer including an array of independently addressable pixels, each pixel configured for receiving a drive signal and, in response to the drive signal, selectively applying a phase modification to the wavelength components incident onto the pixel to directionally steer the wavelength components along respective angularly separated paths;

at least one path defining a collection path being a path wherein the corresponding wavelength component is able to be collected and processed by an optical system.

2. A tunable optical filter according to claim 1 wherein the diffractive layer includes an electrode layer for applying an independent electric voltage drive signal to each pixel.

3. A tunable optical filter according to claim 2 wherein the electrode layer includes:

an array of electrically isolated regions, each configured for applying a drive signal to a corresponding pixel; and a diffractive grating structure etched across the regions.

4. A tunable optical filter according to claim 1 wherein the phase manipulation layer is configured for independently controlling the wavelength and phase of the wavelength components.

5. A tunable optical filter according to claim 1 including a refractive prism layer disposed between the diffractive layer and the phase manipulation layer, wherein the refractive prism layer is configured to:

receive the input optical signal;

refract the signal onto the phase manipulation layer at a first predefined angle; and passively guide the phase manipulated signal onto the diffractive layer at a second predefined angle to selectively steer at least one wavelength component along a collection path to be collected and processed by an optical system.

6. A tunable optical filter according to claim 1 wherein the pixels are driven to define a periodic phase profile for selectively defining the angle at which the optical signal is steered.

7. A tunable optical filter according to claim 6 wherein the phase profile includes periodic phase resets and the position of the resets controls the phase of the wavelength components.

8. A tunable optical filter according to claim 6 wherein periodicity of the phase profile controls the wavelength of the wavelength component transmitted along the collection path.

9. A tunable optical filter according to claim 1 wherein the pixels are driven to define a phase profile having two or more superimposed diffractive phase functions for directionally steering two or more components along the collection path.

10. A tunable optical filter according to claim 1 wherein the pixels are digitally electrically driven to provide substantially continuous wavelength tuning over a predetermined wavelength range.

11. A tunable optical filter according to claim 1 wherein the pixels are digitally electrically driven to provide substantially continuous power attenuation control over a predetermined wavelength range.

12. A tunable optical filter according to claim 1 wherein the array of independently addressable pixels is two-dimensional having a first dimension and a perpendicular second dimension and wherein the pixels are configured to directionally steer the wavelength components along paths in one or both of the first dimension and the second dimension.

13. A tunable optical filter according to claim 12 wherein rows of pixels in the first dimension are driven with first phase profiles to directionally steer the wavelength components along paths in the first dimension and columns of pixels in the second dimension are driven with second phase profiles to selectively attenuate specific wavelength components.

14. A tunable optical filter according to claim 3 wherein the grating structure is periodic.

15. A tunable optical filter according to claim 3 where the grating structure is aperiodic.

16. A tunable optical filter according to claim 3 wherein the grating is configured for operation in a Littrow configuration.

17. A tunable optical filter according to claim 1 wherein the input optical signal is incident onto the phase manipulation layer at an angle of greater than 45° to its normal direction.

18. A wavelength tunable laser having a cavity for resonantly supporting oscillation of optical signals and a tunable optical filter according to claim 1 for allowing wavelength components propagating along the collection path to oscillate resonantly within the cavity while restricting wavelength components propagating along other paths from oscillating within the cavity.

19. A wavelength tunable laser according to claim 18 further including a phase locking element for locking the relative phase between wavelength components resonantly supported in the cavity.

20. A wavelength tunable laser according to claim 19 including an optical separator for spatially separating components of the optical signal for incidence onto different regions of the phase manipulation layer.

21. A wavelength tunable laser according to claim 20 wherein the optical separator includes:
at least one splitting element for splitting the optical signal into two or more signal components;
an optical delay element for introducing a relative phase difference between the signal components; and
an optical power element for imaging the signal components together at an imaging plane to produce interference fringes at physical locations along the plane that depend upon the relative phase difference between the signal components.

22. A tunable optical filter for receiving an input optical signal having a plurality of wavelength components, filtering the input optical signal and outputting a filtered optical signal having a subset of the wavelength components, the filter including a phase manipulation element configured for simultaneously and independently controlling both the phase and center wavelength of the filtered optical signal.

23. A mode-locked tunable laser including:
a cavity for supporting oscillation of an optical signal;
a gain element for amplifying the optical signal oscillating in the cavity;
a gain modulation element for selectively modulating the gain of the optical signal;
a wavelength selective phase manipulation element configured for selecting specific wavelength components to be supported in the cavity and for independently controlling the phase of the wavelength components.

24. A mode-locked tunable laser according to claim 23 wherein the cavity is configured to support a plurality of spatially separated and spectrally distinct wavelength components and the wavelength selective phase manipulation element is configured to individually manipulate the phase of the different wavelength components to simultaneously mode-lock each component.

* * * * *